United States Patent
Zhang et al.

(10) Patent No.: US 6,911,361 B2
(45) Date of Patent: *Jun. 28, 2005

(54) LOW TEMPERATURE PROCESSING OF PCMO THIN FILM ON IR SUBSTRATE FOR RRAM APPLICATION

(75) Inventors: Fengyan Zhang, Vancouver, WA (US); Wei-Wei Zhuang, Vancouver, WA (US); Wei Pan, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 12 days.

This patent is subject to a terminal disclaimer.

(21) Appl. No.: 10/384,846

(22) Filed: Mar. 10, 2003

(65) Prior Publication Data

US 2004/0180507 A1 Sep. 16, 2004

(51) Int. Cl.[7] ..................... H01L 21/8242; H01L 21/31; H01L 21/469
(52) U.S. Cl. ...................................... 438/240; 438/785
(58) Field of Search ........................... 438/240, 3, 783, 438/785, 782

(56) References Cited

U.S. PATENT DOCUMENTS

| 6,664,117 B2 | * | 12/2003 | Zhuang et al. | 438/3 |
| 6,759,249 B2 | * | 7/2004 | Zhuang et al. | 438/3 |
| 6,774,054 B1 | * | 8/2004 | Zhang et al. | 438/781 |
| 2004/0160819 A1 | * | 8/2004 | Rinerson et al. | 365/171 |

OTHER PUBLICATIONS

U.S. Appl. No. 10/759,468.*

* cited by examiner

*Primary Examiner*—Erik Kielin
(74) *Attorney, Agent, or Firm*—David C. Ripma; Joseph P. Curtin

(57) ABSTRACT

A method of applying a PCMO thin film on an iridium substrate for use in a RRAM device, includes preparing a substrate; depositing a barrier layer on the substrate; depositing a layer of iridium on the barrier layer; spin coating a layer of PCMO on the iridium; baking the PCMO and substrate in a three-step baking process; post-bake annealing the substrate and the PCMO in a RTP chamber; repeating said spin coating, baking and annealing steps until the PCMO has a desired thickness; annealing the substrate and PCMO; depositing a top electrode; and completing the RRAM device.

11 Claims, 1 Drawing Sheet

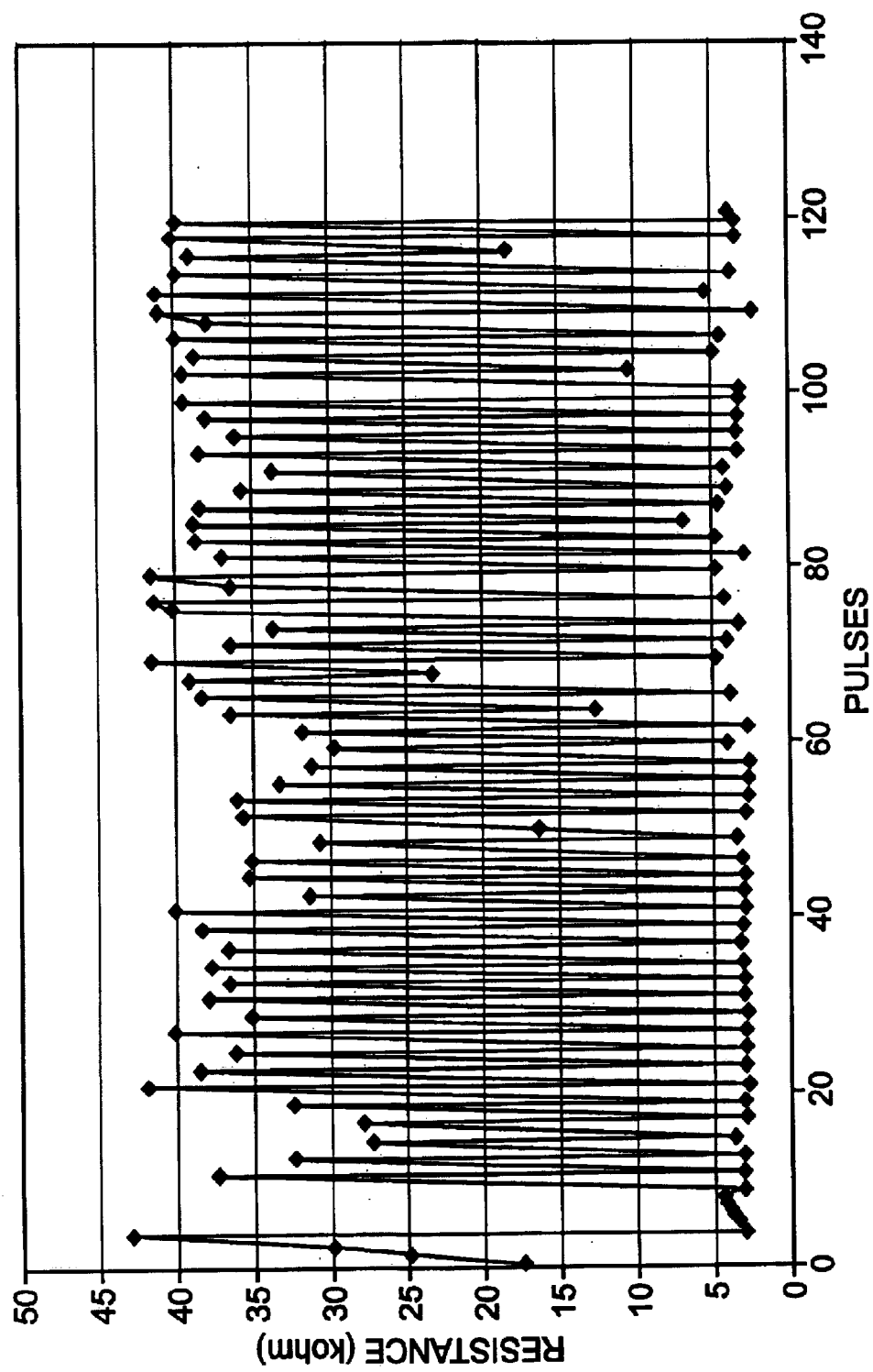
Figure

LOW TEMPERATURE PROCESSING OF PCMO THIN FILM ON IR SUBSTRATE FOR RRAM APPLICATION

RELATED APPLICATION

This application is related to Ser. No. 10/256,380, filed Sep. 26, 2002, for Method for Resistance Memory Metal Oxide Chain Film Deposition.

FIELD OF THE INVENTION

This invention relates to a method of growing a PCMO thin film on an iridium substrate for RRAM applications, and specifically, to a technique for depositing multiple layers of $Pr_{0.7}Ca_{0.3}MnO_3$ (PCMO) to provide a resistance layer.

BACKGROUND OF THE INVENTION

An electrically-programmable resistance, non-volatile memory device, which operates at room temperature which uses a PCMO thin film on a platinum substrate was demonstrated by Zhuang, et al. in the above-identified related application. The related application describes the fabrication steps of t PCMO thin film on a substrate.

A PCMO thin film grown on a platinum substrate at a low heat treatment temperature exhibits amorphous or polycrystalline structure. A resistor incorporating such a PCMO thin film may be reversibly programmed to a high or a low resistance state by a unipulse having different pulse widths. A technique for forming and programming such a structure is described herein.

SUMMARY OF THE INVENTION

A method of applying a PCMO thin film on an iridium substrate for use in a RRAM device, includes preparing a substrate; depositing a barrier layer on the substrate; depositing a layer of iridium on the barrier layer; spin coating a layer of PCMO on the iridium; baking the PCMO and substrate in a three-step baking process; post-bake annealing the substrate and the PCMO in a RTP chamber; repeating said spin coating, baking and annealing steps until the PCMO has a desired thickness; annealing the substrate and PCMO; depositing a top electrode; and completing the RRAM device.

It is an object of the invention to provide a method of deposition of PCMO thin film on an Ir substrate for use in RRAM applications.

Another object of the invention is provide a RRAM which may be programmed by a pulse having a varying pulse width.

This summary and objectives of the invention are provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWING

The FIGURE is a graph depicting the resistance switch properties of a PCMO thin film deposited on an Ir substrate according to the method of the invention.

DETAILED DESCRIPTION OF THE PREFERRED EMBODIMENTS

Iridium is deposited on a substrate having a top layer of silicon, silicon dioxide, or polysilicon. A barrier layer of Ta, TaN, Ti, TiN, TiAlN, TaAlN, TiSiN, TaSiN, TiAl, or TiAlN is formed on the substrate by PVD, CVD or MOCVD, to a thickness of between about 10 nm to 100 nm. A layer of iridium is deposited on the barrier layer by PVD, CVD or MOCVD, to a thickness of between about 50 nm to 500 nm. A first layer of $Pr_{0.7}Ca_{0.3}MnO_3$ (PCMO) thin film is spin coated on the iridium surface. A number of precursor may be used to form the PCMO thin film, such as $Pr(CH_3CO_2)_3.H_2O$, $Ca(CH_3CO_2)_2.H_2O$, or $Mn(III)(CH_3CO_2)_3.2H_2O$, in an acetic acid solvent. Once a PCMO layer is deposited by spin coating, the film and substrate are baked in a three step process, wherein the first baking step includes baking at between about 50° C. to 150° C. for between about ten seconds and one hour; the second step includes baking at a temperature of between about 100° C. to 200° C. for between about ten seconds and one hour, and the third step includes baking at a temperature of between about 150° C. to 300° C. for between about ten seconds and one hour. This three step baking process provides for better material structure that does a single baking step or a single annealing step. After the baking steps are completed, the film is rapid thermal processed (RTP) in an annealing step after each spin coating and baking step at a temperature of between about 400° C. to 550° C. for between about ten seconds to one hour. The coating-baking-RTP process is repeated until a number of PCMO coating have been deposited and the PCMO has reached the desired thickness, generally between about 10 nm and 100 nm, which typically requires between one and fifty spin-coating-baking-RTP cycles.

The PCMO film and substrate are put in a RTP chamber for a post-bake annealing heat treatment, at a temperature between about 450° C. to 550° C. for a time of between about one minute to twenty-four hours. A platinum, iridium, or other noble metal layer, or a metal oxide top electrode is then deposited on the PCMO thin film and patterned using, either shallow mask or a dry etching process. The post-bake annealing step may also be performed after the top electrode is deposited and etched.

FIG. 1 depicts the resistance switching properties of PCMO thin film deposited on an iridium substrate. This film was RTP pre-annealed at 500° C. for five minutes for each coating and RTP annealed at 550° C. for fifteen minutes. There are three layers of PCMO in the device. The write condition is 5V, 200 ns and the reset condition is –3.5V, 4 us. The write resistance is about 10 times higher than the reset resistance.

Thus, a method for low temperature processing of PCMO thin film on Ir substrate for RRAM application has been disclosed. It will be appreciated that further variations and modifications thereof may be made within the scope of the invention as defined in the appended claims.

We claim:

1. A method of applying a PCMO thin film on an iridium substrate for use in a RRAM device, comprising:
   preparing a substrate;
   depositing a barrier layer on the substrate;
   depositing a layer of iridium on the barrier layer;
   spin coating a layer of PCMO on the iridium;
   baking the PCMO and substrate in a three-step baking process, wherein a temperature for each step in the three-step baking process is higher than the temperature of the previous step;
   post-bake annealing the substrate and the PCMO in a RTP chamber;
   repeating said spin coating, baking and annealing steps until the PCMO has a desired thickness;

annealing the substrate and PCMO;

depositing a top electrode; and completing the RRAM device.

2. The method of claim 1 wherein said preparing a substrate includes preparing a silicon substrate having a top layer taken from the group of materials consisting of silicon, silicon dioxide and polysilicon.

3. The method of claim 1 wherein said depositing a barrier layer includes depositing a barrier layer taken from the group of material consisting of Ta, TaN, Ti, TiN, TiAlN, TaAlN, TiSiN, TaSiN, TiAl and TiAlN.

4. The method of claim 1 wherein said spin coating includes selecting a PCMO precursor taken from the group of precursors consisting of $Pr(CH_3CO_2)_3 \cdot H_2O$, $Ca(CH_3CO_2)_2 \cdot H_2O$, and $Mn(III)(CH_3CO_2)_3 \cdot 2H_2O$, in an acetic acid solvent.

5. The method of claim 1 wherein said baking the PCMO and substrate in a three-step baking process includes a first baking step at a temperature of between about 50° C. to 150° C. for between about ten seconds and one hour; a second baking step at a temperature of between about 100° C. to 200° C. for between about ten seconds and one hour, and a third baking step at a temperature of between about 150° C. to 300° C. for between about ten seconds and one hour.

6. The method of claim 1 wherein said post-bake annealing the substrate and the PCMO in a RTP chamber includes annealing at a temperature of between about 400° C. to 550° C. for between about ten seconds to one hour.

7. The method of claim 1 wherein said annealing the substrate and PCMO includes annealing the substrate and PCMO at a temperature between about 450° C. to 550° C. for a time of between about one minute to twenty-four hours.

8. A method of applying a PCMO thin film on an iridium substrate for use in a RRAM device, comprising:

preparing a substrate;

depositing a barrier layer on the substrate;

depositing a layer of iridium on the barrier layer;

spin coating a layer of PCMO on the iridium including selecting a PCMO precursor taken from the group of precursors consisting of $Pr(CH_3CO_2)_3 \cdot H_2O$, $Ca(CH_3CO_2)_2 \cdot H_2O$, and $Mn(III)(CH_3CO_2)_3 \cdot 2H_2O$, in an acetic acid solvent;

baking the PCMO and substrate in a three-step baking process including a first baking step at a temperature of between about 50° C. to 150° C. for between about ten seconds and one hour; a second baking step at a temperature of between about 100° C. to 200° C. for between about ten seconds and one hour, and a third baking step at a temperature of between about 150° C. to 300° C. for between about ten seconds and one hours, wherein a temperature for each step in the three-step baking process is higher than the temperature of the previous step;

post-bake annealing the substrate and the PCMO in a RTP chamber at a temperature of between about 400° C. to 550° C. for between about ten seconds to one hour;

repeating said spin coating, baking and annealing steps until the PCMO has a desired thickness;

annealing the substrate and PCMO;

depositing a top electrode; and completing the RRAM device.

9. The method of claim 8 wherein said preparing a substrate includes preparing a silicon substrate having a top layer taken from the group of materials consisting of silicon, silicon dioxide and polysilicon.

10. The method of claim 8 wherein said depositing a barrier layer includes depositing a barrier layer taken from the group of material consisting of Ta, TaN, Ti, TiN, TiAlN, TaAlN, TiSiN, TaSiN, TiAl and TiAlN.

11. The method of claim 8 wherein said annealing the substrate and PCMO includes annealing the substrate and PCMO at a temperature between about 450° C. to 550° C. for a time of between about one minute to twenty-four hours.

* * * * *